United States Patent
Hong et al.

[11] Patent Number: 5,529,943
[45] Date of Patent: Jun. 25, 1996

[54] METHOD OF MAKING BURIED BIT LINE ROM WITH LOW BIT LINE RESISTANCE

[75] Inventors: Gary Hong; Chen C. Hsue, both of Hsin-chu, Taiwan

[73] Assignee: United Microelectronics Corporation, Hsin-Chu, Taiwan

[21] Appl. No.: 316,136

[22] Filed: Sep. 30, 1994

[51] Int. Cl.$^6$ .................................... H01L 21/8246
[52] U.S. Cl. .................... 437/48; 437/67; 437/203
[58] Field of Search .................... 437/48, 63, 64, 437/67, 203; 148/DIG. 50

[56] References Cited

U.S. PATENT DOCUMENTS

| | | | |
|---|---|---|---|
| 4,912,535 | 3/1990 | Okumura | 257/506 |
| 5,021,355 | 6/1991 | Dhong et al. | 437/203 |
| 5,084,418 | 1/1992 | Esquivel et al. | 437/48 |
| 5,429,973 | 7/1995 | Hong | 437/48 |

*Primary Examiner*—Chandra Chaudhari
*Attorney, Agent, or Firm*—Meltzer, Lippe, Goldstein et al.

[57] ABSTRACT

A ROM array comprises orthogal sets of buried bit lines and polysilicon wordlines. The buried bit lines comprise trenches with insulating material on the side walls, the trenches then being filled with polysilicon. This reduces bit line sheet resistance and increases the punch-through voltage between adjacent bit lines.

3 Claims, 4 Drawing Sheets

METHOD OF MAKING BURIED BIT LINE ROM WITH LOW BIT LINE RESISTANCE

FIELD OF THE INVENTION

The present invention relates to a buried bit line ROM with a low bit line sheet resistance and a high punch-through voltage and a process for making such a ROM.

BACKGROUND OF THE INVENTION

As the memory density of a ROM increases, the cell dimensions decrease, resulting in high sheet resistance ($R_s$) of buried bit lines in the ROM. This is because a decrease in cell dimension causes a decreased width in the bit line which increases bit line sheet resistance. The reduced spacing between the bit lines also results in an unacceptably low punch-through voltage between adjacent bit lines.

FIG. 1 illustrates a buried bit line ROM 20. The ROM 20, for illustrative purposes, comprises a P-type silicon substrate 21. Of course, the ROM could alternatively have an N-type substrate. In this example, a plurality of $N^{+-}$ type buried bit lines 22 are formed in the ROM 20. Each bit line 22 has a width W and the spacing, or channel, between adjacent bit lines has a length S. A plurality of polysilicon word lines 24 are also formed on the surface of the substrate 21. The ROM 20 comprises a plurality of cells. One such cell 30 is shown in dashed lines in FIG. 1. A cross-sectional view of cell 30 of FIG. 1 taken along the line AA' is shown in FIG. 2.

As seen in FIG. 2, the cell 30 comprises two adjacent buried bit lines 22 which form source and drain regions for the cell. A channel 32 of length S is formed between the two bit lines in the cell 30. A gate oxide layer 36, 37 is formed on top of the substrate 11. The oxide layer is thicker at portions 36 located above the bit lines 22 and thinner at portion 37 located above the channel 32. The thick oxide layer portions 36 are known as field oxide (FOX) regions and the thinner layer portions 37 are known as gate oxide regions. A polysilicon word line 24 is formed over the gate oxide layer 36.

As indicated above, when the bit line width W is too small, the bit line sheet resistance is unacceptably high. In addition, when the bit line spacing S, or channel, is too small, the punch-through voltage between adjacent bit lines is unacceptably low.

Co-pending application Ser. No. 08/092,189 filed on Jul. 14, 1993 and now U.S. Pat. No. 5,430,673 to the same inventors and assigned to the same assignee discloses a buried bit line ROM with low bit line resistance. That memory device and method for making it relate to a memory cell having either the source or drain at the sides and bottom of a trench. Thus, each trench forms either a single source or drain. Also, the fabrication process for the device disclosed therein is different than the process disclosed below.

A buried bit line memory device is also disclosed in U.S. Pat. No. 4,912,535 to Okumura. Okumura discloses a RAM type memory cell having a diffusion region on one side of a trench.

It is an object of the present invention to provide a buried bit line structure and a method for making a buried bit line structure which eliminates the sheet resistance and punch-through voltage problems in high density buried bit line ROMs having small bit line width and spacing.

SUMMARY OF THE INVENTION

The present invention uses a trench filled either with polysilicon or spin-on-glass (SOG) and polysilicon to form the buried bit lines in a ROM. This reduces bit line resistance and increases punch-through voltage.

DETAILED DESCRIPTION OF THE INVENTION

FIGS. 3–10 illustrate one method for forming a memory cell having buried bit lines in accordance with the present invention.

Figure 1:
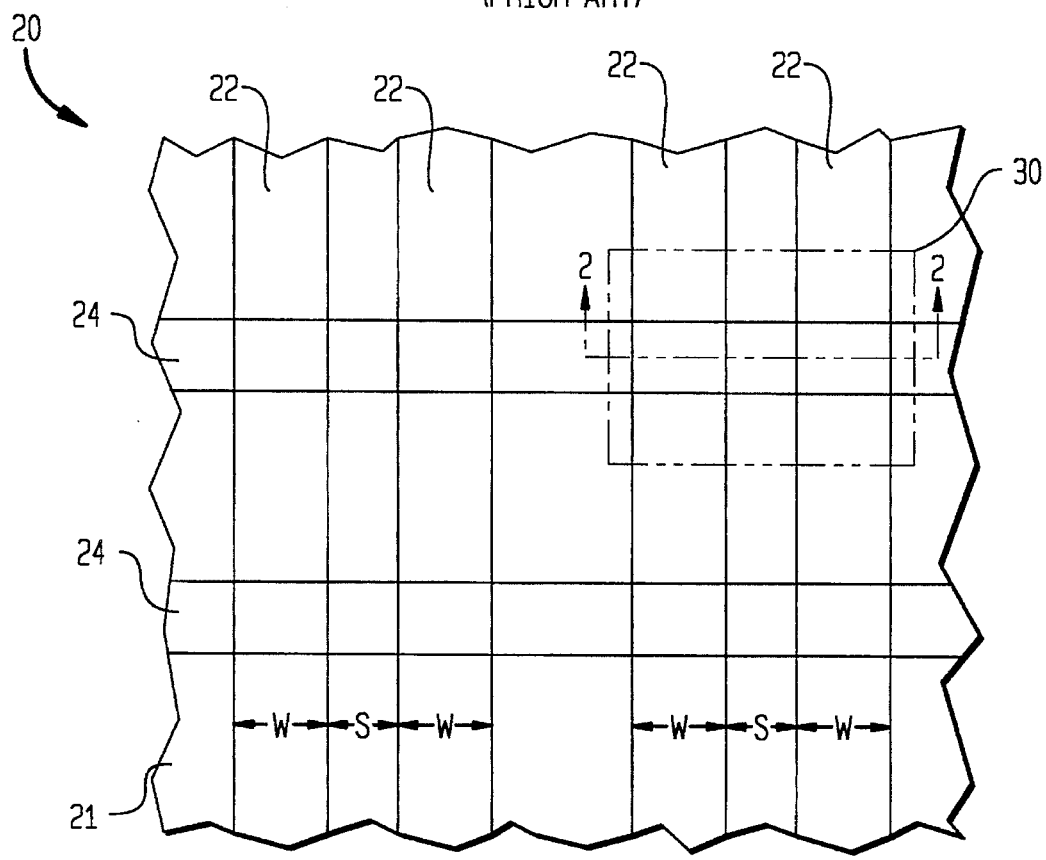
FIG. 1 illustrates a conventional buried bit line ROM array.
Figure 2:
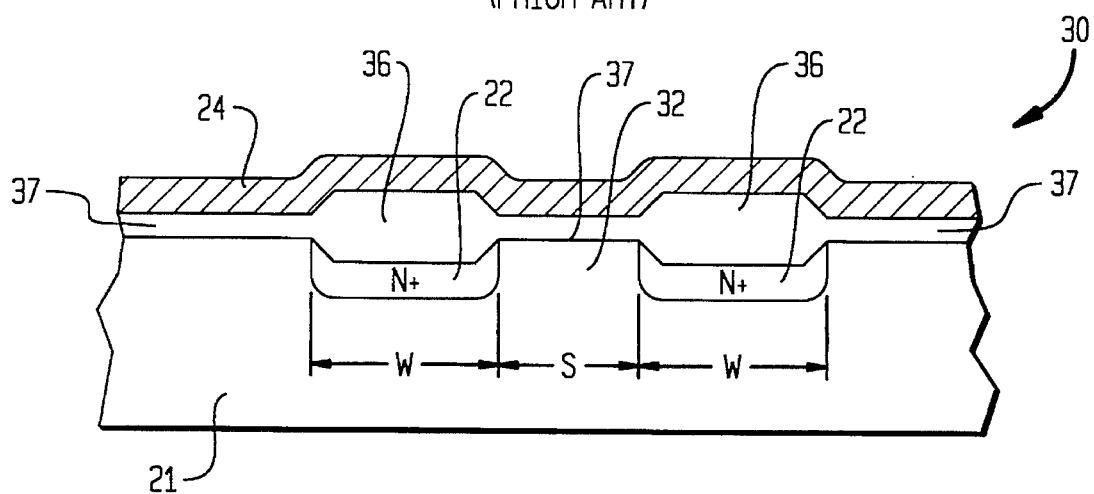
FIG. 2 illustrates a cross-sectional view of one ROM cell in the array of FIG. 1.
Figure 3:
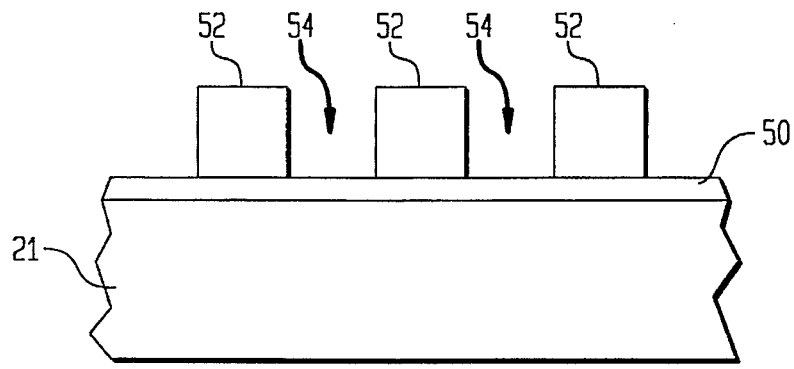
FIGS. 3–10 illustrate one method of fabricating buried bit lines according to the present invention.

As seen in FIG. 3, the starting point is a silicon substrate 21 which illustratively is of P-type and is doped with boron atoms. The substrate has a dopant concentration of about 1.0 E15/cm$^3$. A dielectric layer 50, for example a silicon nitride layer ($Si_3N_4$), preferably having a thickness of about 1000 Ångstroms, is deposited on top of the substrate 21.

A layer of photo-resist is then deposited on top of the first insulation layer 50. The photo-resist layer is patterned to form photo-resist stripe portions 52, which stripes are separated by the openings 54, which leave portions of the insulation layer 50 exposed.

Figure 4:
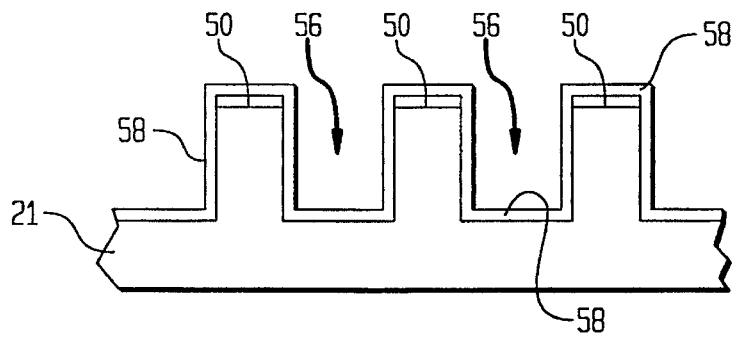

Using the photo-resist stripes 52 as a mask, the portions of the insulation layer 50 exposed by the opening 54 and the underlying substrate 21 are etched using a dry etch to a predetermined depth, preferably 1 micron. The photo-resist portions 52 are then removed. The resulting trenches 56 are seen in FIG. 4.

A dielectric, such as $SiO_2$, is then deposited or thermally oxidized on the exposed surfaces, including the side walls and bottom of the trenches 56, forming a second dielectric layer 58, preferably having a thickness between 500–2000 Ångstroms.

Figure 5:
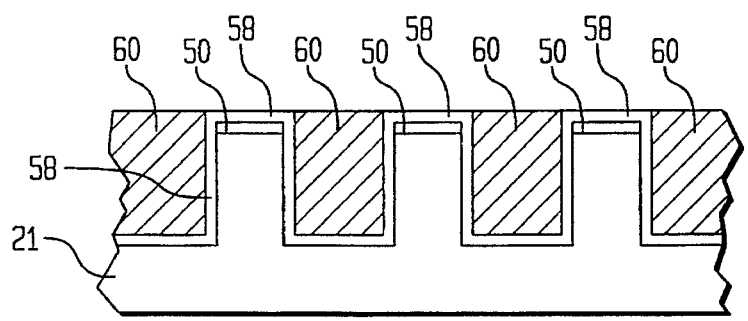
Figure 6:
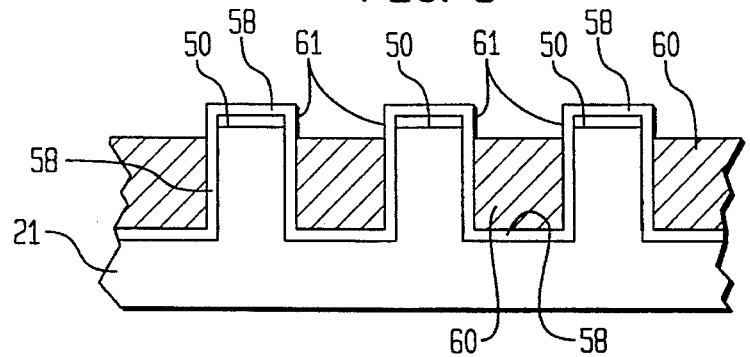
Figure 7:
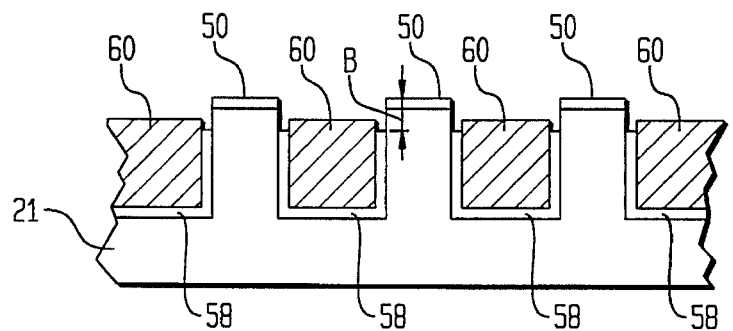

As seen is FIG. 5, the trenches are filled with a first polysilicon material (poly 1) 60. The poly 1 material 60 is doped to be the opposite conductivity of the substrate 21, in this example, to be $N^+$type. The doping can be accomplished using $POCl_3$ at 800°–950° C. for 10–30 minutes. Alternatively, arsenic atoms can be implanted using ion implantation at 50 KeV with a dose of $1\times10^{15}$/cm$^2$-$1\times10^{16}$/cm$^2$. As seen in FIG. 6, after the poly 1 material 60 is doped, it is etched back to expose an upper portion 61 of the dielectric-covered trench walls. Next, as seen in FIG. 7, the exposed dielectric layer 58 is etched back. The buried strap depth B, preferably 0.05–0.2 microns, is controlled by the etch back depth of the polysilicon trench 60 fill and the removal of the exposed insulator 58.

Figure 8:
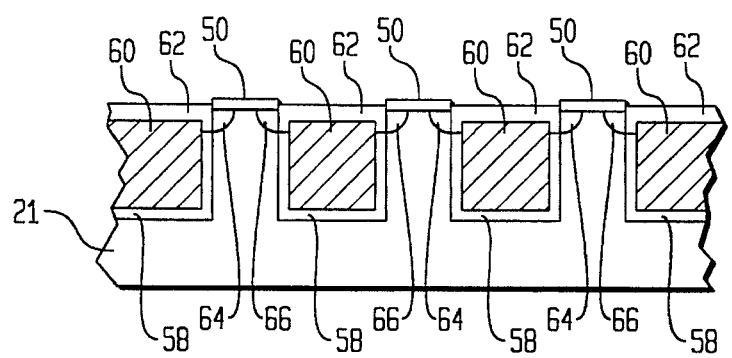

As seen in FIG. 8, the unfilled portion of the trench is filled with a second layer of polysilicon (poly 2) 62. This layer 62 is heavily doped to be the opposite conductivity of the substrate 21, in this example to be $N^+$type. The doping can be accomplished using $POCl_3$. Alternatively, As or phosphorus ions may be implanted using ion implantation. The poly 2 layer 62 is then etched back or CMP (chemical mechanical polished) back.

The heavily doped poly 2 layer 62 is the source of dopant (or impurities) which diffuse by side diffusion, and in this example N⁺side diffusion, through the portions of the trench wall not having an insulation layer 58. This side diffusion forms regions 64 and 66 in the two bit lines in the cell 30. Regions 64 and 66, along with region 62 to which each is electrically connected, form the source and drain regions, of the memory cell 30. Thus, the source is formed by one set of regions either 64 and 62, or 66 and 62 of one bit line 22 and the drain is formed by another set of regions either 64 and 62, or 66 and 62 of an adjacent bit line 22. The spacing, or channel, S is the distance between the bit lines, that is, the distance between region 64 and region 66.

Figure 9:
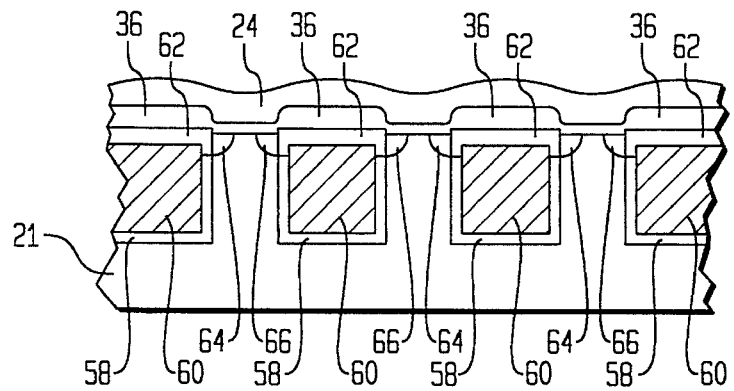

As seen in FIG. 9, the remainder of the first insulation layer 50 is etched off and an oxide layer is then thermally grown on the substrate 21. The oxide layer preferably has a thickness of 100–200 Ångstroms at the gate oxide region 37 and a thickness of 200–500 Ångstroms at the oxide region 36. On top of the oxide layer 36, 37 is formed the polysilicon word line 24.

Figure 10:
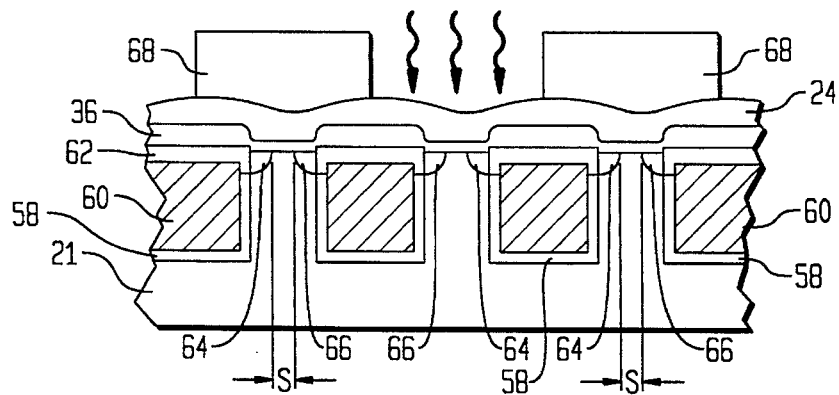
Figure 11:
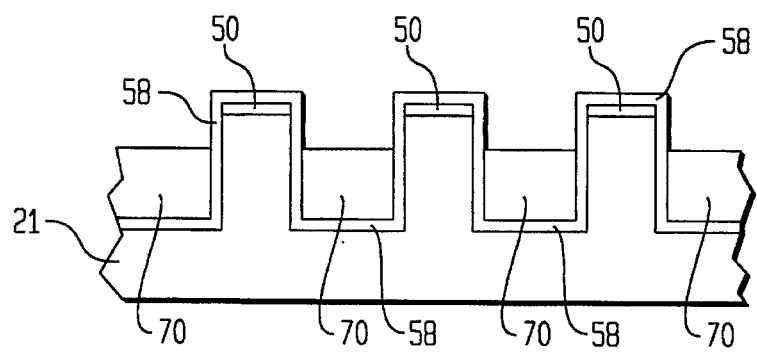
FIGS. 11–14 illustrate a second method of formulating buried bit lines according to the present invention.

As seen in FIG. 10, a layer of photoresist 68 is positioned on top of the polysilicon word line 24 to mask the device for ROM coding. The ROM code implant is performed in any well known conventional manner. For example, it can be performed by ion implantation at 50 KeV, with a dose of dopant being, for example, boron at 150 KeV and $1 \cdot 10^{14}/cm^2$.

The photoresist layer 68 is removed. The rest of the processes for completing the ROM array are entirely conventional back-end processes including BPSG, contacts, metallization, and ROM coding.

Figure 12:
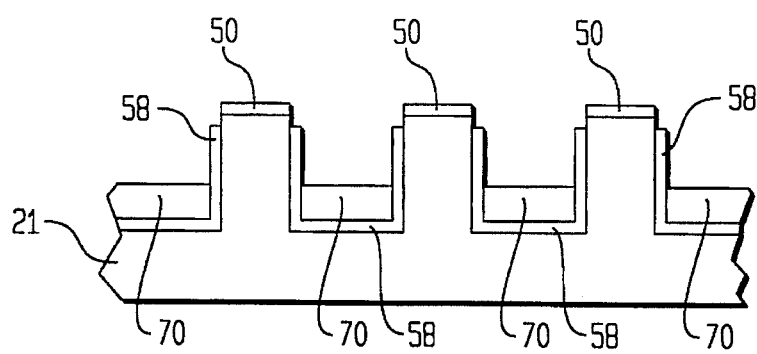

FIGS. 11–14 illustrate a second method for forming a memory cell having buried bit lines in accordance with the present invention. These steps replace those disclosed in FIGS. 5–9. Beginning with the structure shown in FIG. 4, the trench is partially filled with a deposition of spin-on-glass (SOG) 70. FIG. 12 shows an anisotropic over-etch of the $SiO_2$ using plasma etch with $F_2$-based or $Cl_2$-based gases.

Figure 13:
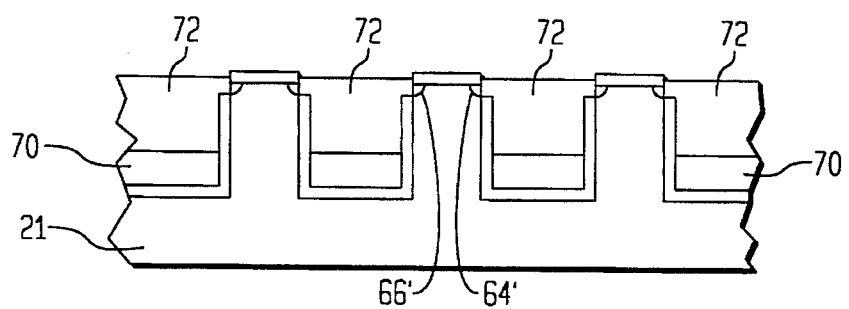

As seen in FIG. 13, after the second dielectric layer 58 etch, the trenches are filled with a first layer of polysilicon 72 (poly 1'). Before the poly 1' layer 72 is deposited in the trench, the SOG can optionally be etched off by BOE (buffer HF oxide etch). The poly 1' material is doped to the opposite conductivity of the substrate 21, in this example to be N⁺type. This doping is performed in the same way as the doping described for the polysilicon material 60, described above. Side diffusion, in this example N⁺side diffusion, for the portions of the trench wall not having an insulation layer 58 is utilized in the regions 64' and 66' of each of two bit lines in the cell 30, along with region 72 to which they are each electrically connected, form the source and drain regions of the memory cell 30. Thus, the source is formed by one set of regions 64'/72, or 66'/72 of one bit line 22 and the drain is formed by another set of regions 64'/72, or 66'/72 of an adjacent bit line 22.

Figure 14:
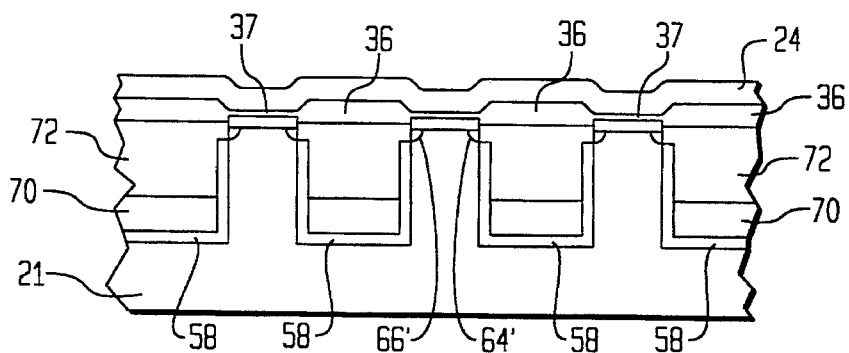

As seen in FIG. 14, the first insulation layer 50 is etched off and a oxidation layer 36, 37 is then formed on substrate 21. The polysilicon word line 24 is then formed on top of the oxide layer 36. This layer is heavily doped to the opposite conductivity as the substrate 21 and etched to the appropriate pattern. The remainder of the process is performed as described in relation to FIG. 10.

The buried bit lines formed by either of the above described poly trench methods result in low bit line sheet resistance and good bit line-to-bit line punch-through voltage. Therefore, the bit line pitch (bit line width plus spacing between adjacent bit lines) can be reduced for a high density ROM array.

The above described embodiments of the invention are intended to be illustrative only. Numerous alternative embodiments may be devised by those skilled in the art without departing from the spirit and scope of the following claims.

We claim:

1. A method for forming a buried bit line for a memory array, comprising the steps of:
   (a) forming a trench having side walls in a semiconductor substrate of a first conductivity type;
   (b) depositing dielectric material in the trench;
   (c) removing a portion of the dielectric material so a top portion of the trench side walls is exposed; and
   (d) creating a dopant source, having an opposite conductivity of the first conductivity type, in the trench for contacting the exposed portion of the sidewall; and
   (e) diffusing dopant from the dopant source into the substrate through the exposed top portion of the sidewall to form a bitline.

2. The method of claim 1, further comprising the step of:
   depositing an oxide layer and a polysilicon layer on top of the trench.

3. The method of claim 1, further comprising the steps of:
   (a) after depositing a dielectric material in the trench, partially filling the trench to a predetermined level with SOG; and
   (b) the step of removing a portion of the dielectric material includes exposing the sidewalls above said predetermined level.

* * * * *